United States Patent
Morten et al.

(10) Patent No.: US 11,625,519 B2
(45) Date of Patent: Apr. 11, 2023

(54) SYSTEMS AND METHODS FOR INTELLIGENT GRAPH-BASED BUFFER SIZING FOR A MIXED-SIGNAL INTEGRATED CIRCUIT

(71) Applicant: Mythic, Inc., Austin, TX (US)

(72) Inventors: Andrew Morten, Redwood City, CA (US); Eric Stotzer, Austin, TX (US); Michael Siegrist, Austin, TX (US); David Fick, Hutto, TX (US)

(73) Assignee: Mythic, Inc., Austin, TX (US)

( * ) Notice: Subject to any disclaimer, the term of this patent is extended or adjusted under 35 U.S.C. 154(b) by 0 days.

(21) Appl. No.: 17/712,805

(22) Filed: Apr. 4, 2022

(65) Prior Publication Data

US 2022/0318467 A1    Oct. 6, 2022

Related U.S. Application Data

(60) Provisional application No. 63/208,229, filed on Jun. 8, 2021, provisional application No. 63/170,681, filed on Apr. 5, 2021.

(51) Int. Cl.
*G06F 30/27* (2020.01)
*G06N 3/04* (2006.01)
(Continued)

(52) U.S. Cl.
CPC ............. *G06F 30/27* (2020.01); *G06F 3/061* (2013.01); *G06F 3/0608* (2013.01);
(Continued)

(58) Field of Classification Search
CPC ........ G06N 20/00; G06N 20/10; G06N 20/20; G06N 3/02; G06N 3/04; G06N 3/06;
(Continued)

(56) References Cited

U.S. PATENT DOCUMENTS

2006/0195706 A1    8/2006  Burchard et al.
2008/0089333 A1    4/2008  Kozat et al.
(Continued)

OTHER PUBLICATIONS

International Application No. PCT/US22/23311, International Search Report and Written Opinion dated Aug. 2, 2022, 9 pages.

*Primary Examiner* — Shane D Woolwine
(74) *Attorney, Agent, or Firm* — Padowithz Alce; Alce PLLC

(57) ABSTRACT

A system and method for minimizing a total physical size of data buffers for executing an artificial neural network (ANN) on an integrated circuit includes implementing a buffer-sizing simulation based on sourcing a task graph of the ANN, wherein: (i) the task graph includes a plurality of distinct data buffers, wherein each of the plurality of distinct data buffers is assigned to at least one write operation and at least one read operation; (ii) the buffer-sizing simulation, when executed, computes an estimated physical size for each of a plurality of distinct data buffers for implementing the artificial neural network on a mixed-signal integrated circuit; and (iii) configuring the buffer-sizing simulation includes setting simulation parameters that include buffer-size minimization parameters and buffer data throughput optimization parameters; and generating an estimate of a physical size for each of the plurality of distinct data buffers based on the implementation of the buffer-sizing simulation.

18 Claims, 6 Drawing Sheets

(51) Int. Cl.
  *G06N 3/063* (2006.01)
  *G06F 3/06* (2006.01)
  *G06N 3/06* (2006.01)
  *G06N 3/10* (2006.01)
  *G06N 20/00* (2019.01)
  *G06N 3/02* (2006.01)

(52) U.S. Cl.
  CPC ............ *G06F 3/0656* (2013.01); *G06N 3/04* (2013.01); *G06N 3/06* (2013.01); *G06N 3/063* (2013.01); *G06F 3/0655* (2013.01); *G06F 3/0683* (2013.01); *G06N 3/02* (2013.01); *G06N 3/10* (2013.01); *G06N 20/00* (2019.01)

(58) Field of Classification Search
  CPC .......... G06N 3/063; G06N 3/10; G06F 30/27; G06F 3/0608; G06F 3/061; G06F 3/0655; G06F 3/0656; G06F 3/0683
  See application file for complete search history.

(56) References Cited

U.S. PATENT DOCUMENTS

| | | | |
|---|---|---|---|
| 2014/0040855 A1* | 2/2014 | Wang | G06F 8/34 717/107 |
| 2020/0201773 A1* | 6/2020 | Alagumuthu | G06F 12/0871 |
| 2020/0272566 A1* | 8/2020 | Saeki | G06N 5/04 |
| 2022/0035743 A1* | 2/2022 | Martin | G06N 5/04 |
| 2022/0058052 A1* | 2/2022 | Birnbaum | G06F 9/3005 |

* cited by examiner

200

```
┌─────────────────────────────────────────────┐
│        Identifying a Task Graph S210        │
└─────────────────────────────────────────────┘

┌ ─ ─ ─ ─ ─ ─ ─ ─ ─ ─ ─ ─ ─ ─ ─ ─ ─ ─ ─ ─ ─ ┐
│        Evaluating the Task Graph S220       │
└ ─ ─ ─ ─ ─ ─ ─ ─ ─ ─ ─ ─ ─ ─ ─ ─ ─ ─ ─ ─ ─ ┘

┌─────────────────────────────────────────────┐
│ Configuring one or more Buffer-Sizing Algorithms S230 │
└─────────────────────────────────────────────┘

┌─────────────────────────────────────────────┐
│ Executing one or more Buffer-Sizing Algorithms S240 │
└─────────────────────────────────────────────┘
```

FIGURE 2

SYSTEMS AND METHODS FOR INTELLIGENT GRAPH-BASED BUFFER SIZING FOR A MIXED-SIGNAL INTEGRATED CIRCUIT

CROSS-REFERENCE TO RELATED APPLICATIONS

This application claims the benefit of U.S. Provisional Application No. 63/170,681, filed 5 Apr. 2021, and U.S. Provisional Application No. 63/208,229, filed 8 Jun. 2021, which are incorporated in their entireties by this reference.

TECHNICAL FIELD

The inventions described herein relate generally to the integrated circuitry architecture field, and more specifically to new and useful intelligent integrated circuits and methods of computing with the intelligent integrated circuit in the integrated circuitry architecture field.

BACKGROUND

Today, the various implementations of artificial intelligence and machine learning are driving innovation in many fields of technology. Artificial intelligence (AI) systems and artificial intelligence models (including algorithms) are defined by many system architectures and models that enable machine learning (deep learning), reasoning, inferential capacities, and large data processing capabilities of a machine (e.g., a computer and/or a computing server). These AI systems and models are often trained intensively to perform one or more specific tasks, such as natural language processing, image recognition, planning, decision-making, and the like. For example, a subset of these AI systems and models include artificial neural network models. The training of an artificial neural network model may, in many cases, require thousands of hours across the training cycle and many terabytes of training data to fine tune associated neural network algorithm(s) of the model before use.

However, once trained, a neural network model or algorithm may be deployed quickly to make inferences to accomplish specific tasks (e.g., recognizing speech from speech input data, etc.) based on relatively smaller datasets when compared to the larger training datasets used during the training cycle. The inferences made by the neural network model or algorithm based on the smaller datasets may be a prediction about what the neural network model calculates to be a correct answer or indication about a circumstance.

Still, while neural network models implementing one or more neural network algorithms may not require a same amount of compute resources, as required in a training phase, deploying a neural network model in the field continues to require significant circuitry area, energy, and compute power to classify data and infer or predict a result. For example, weighted sum calculations are commonly used in pattern matching and machine learning applications, including neural network applications. In weighted sum calculations, an integrated circuit may function to multiply a set of inputs ($x_i$) by a set of weights ($w_i$) and sum the results of each multiplication operation to calculate a final result ($z$). Typical weighted sum calculations for a machine learning application, however, include hundreds or thousands of weights which causes the weighted sum calculations to be computationally expensive to compute with traditional digital circuitry. Specifically, accessing the hundreds or thousands of weights from a digital memory requires significant computing time (i.e., increased latency) and significant energy.

Accordingly, traditional digital circuitry required for computing weighted sum computations of a neural network model or the like tend to be large to accommodate a great amount of digital memory circuitry needed for storing the millions of weights required for the neural network model. Due to the large size of the circuitry, more energy is required to enable the compute power of the many traditional computers and circuits.

Additionally, these traditional computers and circuits for implementing artificial intelligence models and, namely, neural network models may be suitable for remote computing processes, such as in distributed computing systems (e.g., the cloud), or when using many onsite computing servers and the like. However, latency problems are manifest when these remote artificial intelligence processing systems are used in computing inferences and the like for remote, edge computing devices or in field devices. That is, when these traditional remote systems seek to implement a neural network model for generating inferences to be used in remote field devices, there are unavoidable delays in receiving input data from the remote field devices because the input data must often be transmitted over a network with varying bandwidth and subsequently, inferences generated by the remote computing system must be transmitted back to the remote field devices via a same or similar network. Additionally, these traditional circuit often cannot manage the computing load (e.g., limited storage and/or limited compute) and may often rely on remote computing systems, such as the cloud, to perform computationally-intensive computations and store the computation data (e.g., raw inputs and outputs). Thus, constant and/or continuous access (e.g., 24×7 access) to the remote computing systems (e.g., the cloud) is required for continuous operation, which may not be suitable in many applications either due to costs, infrastructure limitations (e.g., limited bandwidth, low grade communication systems, etc.), and the like.

Implementing AI processing systems at the field level (e.g., locally at the remote field device) may be a proposed solution to resolve some of the latency issues. However, attempts to implement some of these traditional AI computers and systems at an edge device (e.g., remote field device) may result in a bulky system with many circuits, as mentioned above, that consumes significant amounts of energy due to the required complex architecture of the computing system used in processing data and generating inferences. Thus, such a proposal without more may not be feasible and/or sustainable with current technology.

Accordingly, there is a need for a deployable system for implementing artificial intelligence models locally in the field (e.g., local AI), and preferably to be used in edge devices, that do not result in large, bulky (edge) devices, that reduces latency, and that have necessary compute power to make predictions or inferences, in real-time or substantially real-time, while also being energy efficient.

The below-described embodiments of the present application provide such advanced and improved integrated circuits and implementation techniques capable of addressing the deficiencies of traditional systems and integrated circuit architectures for implementing AI and machine learning.

BRIEF SUMMARY OF THE INVENTION(S)

In one embodiment, a method for allocating data buffers for executing an artificial neural network on an integrated circuit includes configuring a buffer-sizing simulation based on sourcing a task graph of an artificial neural network, wherein: (i) the task graph includes a plurality of distinct data buffers, wherein each of the plurality of distinct data buffers is assigned to at least one producer task and at least one consumer task; (ii) the buffer-sizing simulation, when executed, computes an estimated physical size for each of a plurality of distinct data buffers for implementing the artificial neural network on an integrated circuit; (iii) configuring the buffer-sizing simulation includes setting simulation parameters that include (a) buffer-size minimization parameters and (b) buffer data throughput optimization parameters; iteratively executing the buffer-sizing simulation based on setting the simulation parameters, wherein executing the buffer-sizing simulation includes simulating a flow of data through each of the plurality of distinct data buffers; and generating an estimate of a physical size for each of the plurality of distinct data buffers based on the execution of the buffer-sizing simulation.

In one embodiment, a method includes allocating the physical size to each of the plurality of distinct data buffers on one or more memory circuits of the integrated circuit based on the generated estimate of the physical size for each of the plurality of distinct data buffers.

In one embodiment, executing the buffer-sizing simulation includes executing a buffer-sizing minimization algorithm that computes a local minimum buffer size for each of the plurality of distinct data buffers that mitigates an occurrence of deadlock based on direct read operations and direct write operations at each of the plurality of distinct data buffers as illustrated in the task graph.

In one embodiment, the occurrence of deadlock relates to an inability write operation to write data to a target data buffer or an inability of a read operation to read data from the target data buffer due to insufficient data.

In one embodiment, generating the estimate of the physical size for each of the plurality of distinct data buffers includes: setting the computed local minimum buffer size for each respective data buffer of the plurality of distinct data buffer as an absolute lower bound of a potential physical size for the respective data buffer.

In one embodiment, executing the buffer-sizing simulation includes executing the buffer-sizing minimization algorithm that computes a non-local minimum buffer size for each of the plurality of distinct data buffers that mitigates the occurrence of deadlock based on indirect read operations and indirect write operations at each of the plurality of distinct data buffers as illustrated in the task graph.

In one embodiment, generating the estimate of the physical size for each of the plurality of distinct data buffers includes: setting a greater of the computed non-local minimum buffer size and a computed local minimum buffer size as the physical size for each respective data buffer of the plurality of distinct data buffer.

In one embodiment, setting the simulation parameters includes setting simulation heuristics that govern a task execution order of write operations to and read operations of a distinct data buffer of the plurality of distinct data buffers, and the simulation heuristics, when executed, cause an interjection of at least one read operation of the read operations between a plurality of write operations of the write operations to the distinct buffer thereby minimizing a physical size of the distinct data buffer.

In one embodiment, setting the simulation parameters includes setting simulation heuristics that: identifies a split-join graph component of the task graph; and simulates a largest physical-sized data buffer before a split in the split-join graph component thereby preventing a simulation of physical data buffers having a physical size exceeding a maximum size threshold within one or more branches of the split-join graph component.

In one embodiment, setting the simulation parameters includes setting simulation heuristics that, when executed: identifies a split-join graph component of the task graph; and maintains, during a simulation session, a physical buffer size of one or more distinct data buffers of a first branch of the split-join graph component causing an increase in one or more distinct data buffers of a second branch of the split-join component.

In one embodiment, setting the simulation parameters includes setting simulation heuristics that govern an execution of a read operation along a tail position of a distinct data buffer of the plurality of distinct data buffers to minimize a latency in consuming from a head position of the distinct data buffer.

In one embodiment, executing the buffer-sizing simulation includes: simulating a data flow through the plurality of distinct data buffers; identifying a data flow imbalance at one or more distinct buffers of the plurality of distinct data buffers based on the simulation of the data flow, wherein a data flow imbalance relates to a loading of data to a target data buffer at a higher rate than a read out of data from the target data buffer resulting in an inability to perform one or more specific read out operations from the target data buffer; and computing a minimum physical size for the target data buffer that mitigates the data flow imbalance based on the identified data flow imbalance.

In one embodiment, the method includes computing, via a linear programming algorithm, one or more iteration rates of read operations of and write operations to a distinct data buffer of the plurality of distinct data buffers; and computing one or more launch times for each of the read operations and each of the write operations that minimizes a physical size of the distinct data buffer based on the computed one or more iteration rates.

In one embodiment, executing the buffer-sizing simulation includes: identifying a list of tasks comprising write tasks and/or read tasks for a target data buffer of the plurality of distinct data buffers; iteratively simulating a plurality of distinct task operation orders based on executing the writes tasks and/or read tasks; and setting a task operation order for each of write tasks and/or read tasks that minimizes a physical size of the target data buffer based on the simulation of the plurality of distinct task operation orders.

In one embodiment, a method for minimizing a total physical size of data buffers for executing an artificial neural network on a mixed-signal integrated circuit includes implementing a buffer-sizing simulation based on sourcing a task graph of an artificial neural network, wherein: (i) the task graph includes a plurality of distinct data buffers, wherein each of the plurality of distinct data buffers is assigned to at least one write operation and at least one read operation; (ii) the buffer-sizing simulation, when executed, computes an estimated physical size for each of a plurality of distinct data buffers for implementing the artificial neural network on a mixed-signal integrated circuit; and (iii) configuring the buffer-sizing simulation includes setting simulation parameters that include (a) buffer-size minimization parameters and (b) buffer data throughput optimization parameters; and generating an estimate of a physical size for each of the plurality of distinct data buffers based on the implementation of the buffer-sizing simulation.

In one embodiment, the method includes allocating the physical size to each of the plurality of distinct data buffers on one or more memory circuits of the mixed-signal integrated circuit based on the generated estimate of the physical size for each of the plurality of distinct data buffers.

In one embodiment, executing the buffer-sizing simulation includes executing a buffer-sizing minimization algorithm that computes a local minimum buffer size for each of the plurality of distinct data buffers that mitigates an occurrence of deadlock based on direct read operations and direct write operations at each of the plurality of distinct data buffers as illustrated in the task graph.

In one embodiment, the occurrence of deadlock relates to an inability write operation to write data to a target data buffer or an inability of a read operation to read data from the target data buffer due to insufficient data.

BRIEF DESCRIPTION OF THE FIGURES

FIG. 2 illustrates an example method in accordance with one or more embodiments of the present application;

DESCRIPTION OF THE PREFERRED EMBODIMENTS

Figure 1:
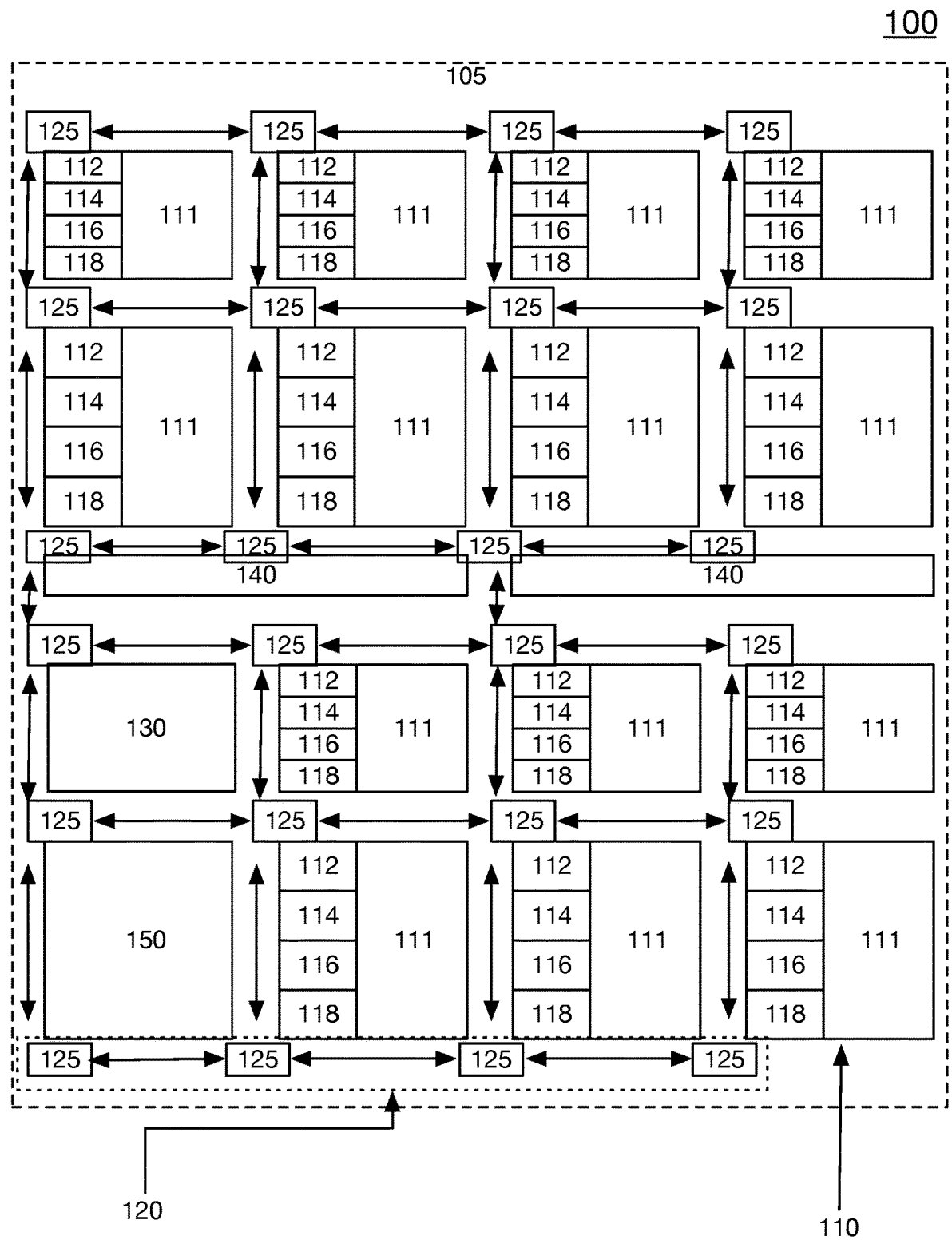
FIGS. 1-1A illustrates a schematic of an intelligence integrated circuit 100 in accordance with one or more embodiments of the present application.

The following description of preferred embodiments of the present application are not intended to limit the inventions to these preferred embodiments, but rather to enable any person skilled in the art of to make and use these inventions.

1. Intelligence Processing Overview

Embodiments of the present application provide a flexible and reprogrammable system that can be programmed to accommodate various computationally-intensive applications or programs of varying complexity and size. While a physical configuration of an integrated circuit architecture according to one or more embodiments of the present application may remain the same or substantially the same, disparate processing elements within the architecture may be programmed to handle multiple applications or one or more sections of a single application.

Further, an implementation and particular arrangement of the storage devices implemented within one or more embodiments of the present application provide several technical benefits over state-of-the-art integrated circuits, including reducing a total requirement of memory or storage required for handling data-intensive applications or programs. For instance, in one embodiment, a distributed memory may include a main (large) buffer may be provided to receive input data (e.g., raw input data or data from an upstream layer or source) and each of a plurality of disparate local buffers may be arranged together with a computing element (e.g., a matrix multiply accelerator) 111. In such embodiment, each local buffer may be arranged adjacent to or in an immediate vicinity of the computing element for fast access and therefore, efficient processing of input data from the main buffer.

Additionally, such an arrangement may allow for asynchronous processing of data along a data processing pipeline thereby enabling multiple segments of data to be processed at a same time and possibly in different stages along the pipeline. That is, in some embodiments, the asynchronous processing of data by the one or more components of the integrated circuit may enable a processing of a plurality of distinct sets of data that may not be in perfect lockstep while enabling simultaneous and/or parallel workflows along distinct components of a data processing pipeline. Such embodiments, the requirement for duplication of data may be significantly reduced.

Additionally, one or more embodiments of the present application may function to implement a token-driven data processing system in which a central process control may not be required.

Specifically, in one or more embodiments, an integrated circuit of the present application may include an architecture that may trigger microprocessor (e.g., a nano-processor which may include a microcontroller that may be local to each compute tile of an integrated circuit) programs and/or applications using tokens. A token as referred to herein preferably relate to a piece of data that evidences or represents an occurrence or an existence of a computing event or transaction and may, additionally or alternatively, evidence or represent a state of one or more components of an integrated circuit. In a non-limiting example, in the circumstances in which a token represents a state of an integrated circuit component, the token may indicate whether a buffer is empty or full, occupied or unoccupied, whether a processor is On or Off, busy (processing) or not busy (not processing), whether an item is processed or unprocessed, and/or the like. While, in many embodiments described herein, the tokens may be used for automatically triggering an execution and/or implementation of programs or applications, in various implementations the tokens may be used to trigger other units. A few examples include, using a combination of one or more instances or one or more tokens may indicate that an action or transaction of an integrated circuit has permission to proceed; possibly, meaning that all of the dependent actions of the action or transaction have occurred. Thus, the tokens may be used to trigger finite state machines, trigger a release of a packet or a work-queue item, trigger the generation of another token, and/or the like. There may be limitless applications of the token-based governance module (sometimes referred to herein as the flow scoreboard module), described in several of the embodiments, for automatically triggering any type and/or any number of functions/operations with the integrated circuit.

In a preferred embodiment of the present application, the integrated circuit architecture may include a network-on-chip system that enables a communication and/or passing of tokens between distinct components of the integrated circuit. Accordingly, in some embodiments, the tokens may represent pieces of dependencies that enable components of the integrated circuit to receive new workloads triggered by an appropriate combination and/or count of one or more tokens. However, it shall be noted that any suitable token communication scheme and/or interconnect may be used including, but not limited to, serial communication buses or the like. For instance, in one embodiment of the present application, a token may not be released and/or generated (irrespective of an interconnect) until an associated triggering event is completed (e.g., an emptying of a local data buffer, a computation by an MMA or the like against input data, and/or any suitable event). In yet another embodiment, a token may be generated and/or released in advance of an associated triggering event if the early release of the token would not cause ordering constraints to be violated. Accordingly, in several of the embodiments of the present application, it shall be noted that the tokens can be deployed in any suitable manner to achieve a token-based control of the flow of data and/or the processing of data throughout an integrated circuit.

Additionally, the token-based governance module described herein may generally function to enable a token-based control by tracking tokens and token triggering conditions and the like. The token-based governance module may have configurable constraints so that triggering may also depend on a state of a local unit or circuit and not only based on a number of tokens identified or received. That is, in several embodiments of the present application, data flow, data processing, one or more operations/functions and the like may be governed based on the release or generation of tokens, it shall be noted that simply determining and/or identifying a state of a component of the integrated circuit and/or identifying a state of a process or operation within the integrated circuit may serve as a triggering event for yet automating another operation, function, process, or flow. For instance, a state of the utilization (e.g., depth) and/or capacity of one or more work queues may function as a triggering event. A technical benefit of such embodiments may be that an operation may only run when computing resources (e.g., space with the one or more work queues) that may be required are available. Accordingly, the embodiments of the present application may provide a flexibility in how events and/or dependencies are configured that trigger an automated operation, function, or process and therefore, allow for the generation of more complex programs or applications that use greater resources or resources more efficiently, which improves an operating efficiency of the one or more systems described herein by reducing a number of events that need to be generated in order to perform some action.

It shall be noted that, in some embodiments, various and/or different tokens may be implemented by a token-based data processing integrated circuit, as described in more detail as in U.S. Pat. No. 10,606,797, which is incorporated herein in its entirety by this reference. In some embodiments, a triggering condition for performing an action within the integrated circuit may be achieved by a minimum number of counts of each of several distinct token types.

2. Intelligence Processing Computing Architecture

Figure 1A:
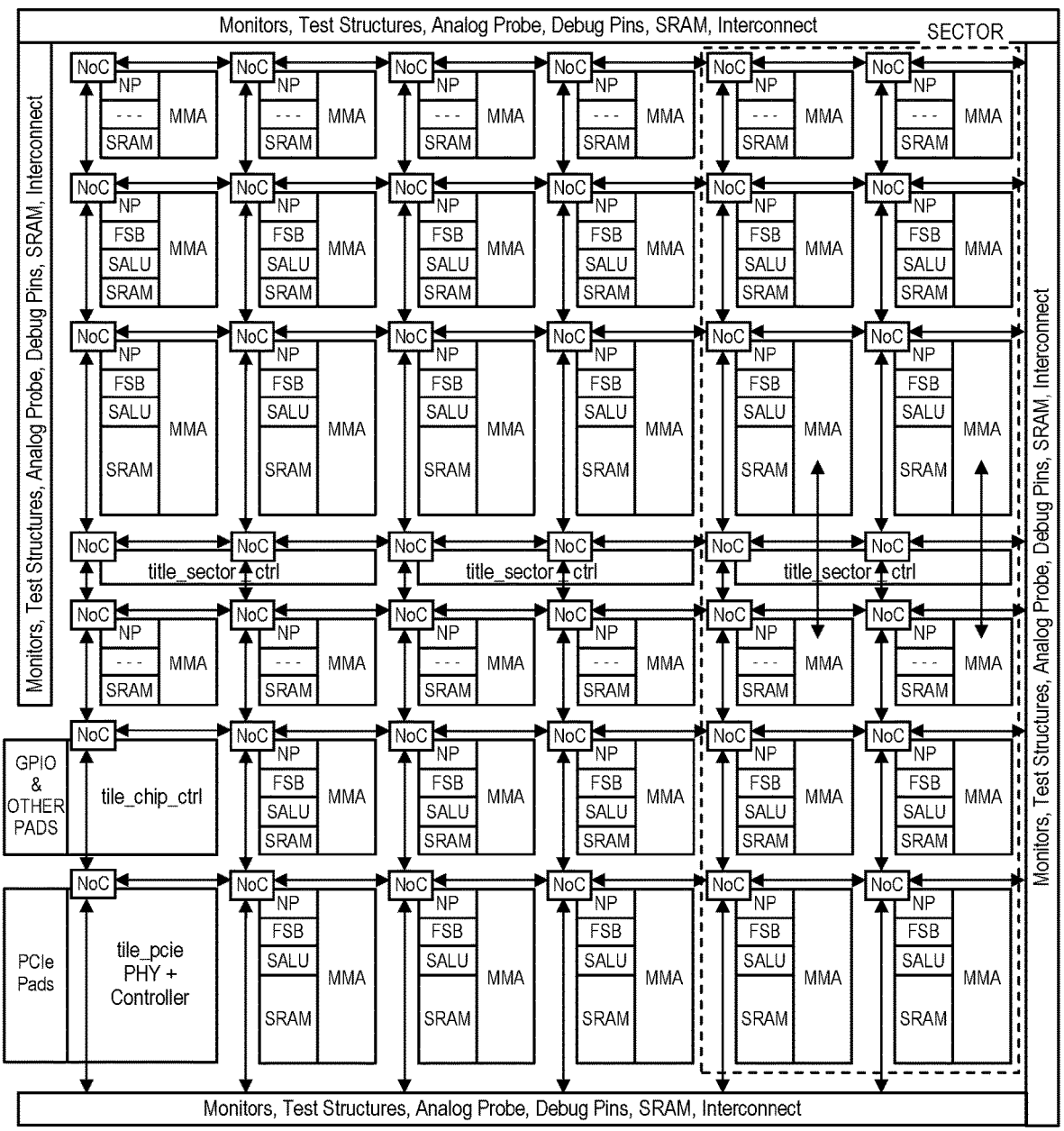

As shown in FIGS. 1-1A, an intelligence processing computing architecture 100 (or alternately referred to herein as an intelligence processing integrated circuit 100) for processing computationally-intensive programs and/or applications (e.g., machine learning applications, neural networks, etc.) includes an intelligence processing array 105 that includes a plurality of intelligence (computing) processing (tiles) units 110, a network on chip system 120 that includes a plurality of network-on-chip routers 125, an integrated circuit controller circuit 130, tile sector controller circuit 140, and a serial connection bus 150. Preferably, each of the plurality of intelligence processing units 110 includes a matrix multiply accelerator in (may also be referred to herein as an accelerator circuit), a computer processing circuit (e.g., a microprocessor, a nano-processor, or the like) 112, a flow scoreboard (token-based governance) module 114, a single instruction multiple data (SIMD) unit 116 (e.g., streaming arithmetic logic unit or the like), and a local buffer (e.g., static random access memory (SRAM) or the like) 118. In some embodiments, a local data buffer 118 may be implemented by an SRAM controller that may include, at least, a SRAM storage or circuit, one or more data transfer engines or circuits (e.g., a DMA controller) that may be used to move data to and/or from the SRAM and other computing resources, an arbitration scheme that selects which controller has access to the SRAM at a given time. Additionally, in one preferred embodiment, each of 130, 140, and 150 may include a computer processing circuit 112, a flow scoreboard module 114, a SIMD 116, and a local data buffer 118. In one or more embodiments, the local data buffer 118 may sometimes be referred to herein as an on-tile memory or on-tile buffer indicating that the local data buffer 118 may be arranged within an intelligence processing tile no and in direct communication with various or one or more circuits, components, and/or modules within the intelligence processing tile 110. FIG. 1A includes a further detailed embodiment of the intelligence processing computing architecture 100 and includes additional peripheral interconnects for interfacing with the intelligence processing array 105. For instance, test structures, monitors, analog probes, and/or any suitable peripheral device may be connected along or arranged along the periphery of the intelligence processing array 105 of the intelligence computing architecture 100.

While in one or more preferred embodiments an intelligence processing unit no may include a matrix multiply accelerator in, a computer processing circuit 112, a flow scoreboard module 114, a SIMD unit 116, and a local buffer 118, it shall be noted that an intelligence processing unit no may include any suitable combination of circuits and modules and therefore, may exclude one or more of the aforementioned circuits and modules and/or may include any combination of the aforementioned circuits and modules without meaningfully departing from the scope of the inventions described in the present application. For instance, in some embodiments, an intelligence processing unit 110 may include or consist of a flow scoreboard module 114 and a local buffer 118 (SRAM) without computational circuitry or the like (e.g., computer processing circuit 112). In another example, an intelligence processing unit no may include or consist of a flow scoreboard module 114, a local buffer 118 (SRAM), and an off-chip interface (e.g., USB, PCIe, HDMI, MIPI-CSI, I2C, ethernet, Bluetooth, and/or any suitable off-chip interface component).

Additionally, or alternatively, while processing within the architecture 100 may include analog processing components or the like, it shall be noted that the embodiments of the architecture 100 may also enable digital processing with any suitable circuitry including, but not limited to, embedded Field Programmable Gate Arrays (eFPGA), Systolic arrays, floating point units, and/or the like.

The intelligence processing array 105 (intelligence accelerator) preferably includes the plurality of distinct intelligence processing units no that may function to work in cooperation to execute a computationally-intensive application or the like. In some embodiments, the intelligence processing array 105 may function to define one or more intelligence processing pipelines that enables a processing of raw input data and/or data from an upstream device or process to a final output state. In such embodiment, each stage (e.g., by one or more disparate intelligence processing units no or the like) of the intelligence processing pipeline may be defined by a disparate intelligence processing unit no that may be specifically programmed to execute a fraction of an application or program. Each of the disparate intelligence processing units 110 of the intelligence processing array 105 preferably functions to operate or compute independently of other or heterogeneous intelligence processing units 110 within the intelligence processing array 105. Accordingly, because each stage of an intelligence processing pipeline may be configured with its own processing section (e.g., intelligence processing unit 110), each intelligence processing pipeline may function to processing input data independently along each stage within the pipeline thereby enabling considerable efficiencies in processing input. That is, asynchronous processing of data or raw input data may be achieved based on the independent processing and/or computations of respective intelligence processing units 110.

Additionally, or alternatively, each of the one or more intelligence processing pipelines defined within the intelligence processing array 105 may be flexibly configured to enable the execution of disparate (non-dependent) applications or programs within the single array 105 or flexibly configured to enable the execution of disparate sections of a single application or a single program along various intelligence processing units 110 within the array 105. For instance, a first neural network application may be programmed along a first section of the intelligence processing array 105 that includes a first collection of intelligence processing units 110 and a second neural network application may be programmed along a second section of the intelligence processing array 105 that includes a second disparate collection of intelligence processing units 110. In a second example, a single computationally-intensive application (e.g., a neural network or the like) may be partitioned into sub-applications (or programs) and each section programmed to a different intelligence processing unit 110 within an array 105. Additionally, or alternatively, in this second example, multiple sections of an application or multiple sub-applications may be programmed to a same intelligence processing unit 110. In yet another example, a plurality of intelligence processing units 110 may be conglomerated to perform one or more sub-sections of a single application or a single program. That is, individual intelligence processing units no may be used to implement only a section of an application or a program and thus, the entirety of the application or the program is handled by a plurality of intelligence processing units 110 that each process only a section of the overall application or program. It shall be noted that the integrated circuit array 105 and/or each intelligence processing units 100 may function to compute the multiple distinct applications and/or the multiple distinct partitions of a single application or single program in parallel (i.e., at the same time), contemporaneously (i.e., processing within a common time period, nearly the same time, etc.), or synchronously (i.e., processing independently of other processes and/or processing units 110). Additionally, it shall be noted that any suitable and/or type of application or program may be partitioned along the intelligence processing array 105 including applications and/or programs that may be partitioned into multiple operational stages that may have dependencies that can be represented as tokens.

The plurality of intelligence processing (tiles) units 110 preferably function to execute an application or a program against some input data received from an upstream device or an upstream layer, such as a buffer or another intelligence processing unit 110. As mentioned above, each of the plurality of intelligence processing units 110 includes a matrix multiply accelerator (e.g., a data processing circuit, or the like) 11, a computer processing circuit (e.g., a microprocessor) 112, a flow scoreboard module 114, a SIMD unit 116, and local data buffer 118 that enables each of the plurality of intelligence processing units 110 to accomplish and/or complete a processing of input data to output data and/or execute an application or program.

Each of the plurality of intelligence processing units 110 preferably functions to pull and/or accesses input data from its local buffer 118, compute against the input data at the matrix multiply accelerator in and output the results (output data) of the computation against the input data back into its local buffer 118 (or possibly to a local buffer of a downstream component or processing section).

In additionally and/or alternative embodiments of the present application, one or more distinct subsets (i.e., two or more) of the plurality of intelligence processing units no of the intelligence array may be clustered and/or conglomerated into a smaller chip (e.g., a chiplet, a system-in-a-package (SIP), 3D packaging, or the like) relative to the overall architecture 100. In such embodiments, a chiplet may be composed within the overall architecture 100 to make a full and/or independent chip. A technical benefit of such embodiments enables an enhanced level of customization of the architecture to be achieved.

In yet further embodiments, multiple integrated circuit architectures 100 may be combined and/or packaged together in a multi-chip architecture. In such embodiments, the multiple architectures 100 may be composed at a system or circuit board (panel) level. The interconnections between the multiple chips may be made using any suitable interconnect technique or interface, including PCIe or specially created bridge interfaces.

The flow scoreboard module 114 is preferably implemented by a combination of one or more computing processing circuits and flow scoreboard sub-modules. Additionally, the flow scoreboard module 114 may include a plurality of interfaces for implementing a flow control of data flowing through the one or more intelligence processing pipelines and a control of the execution of programs or the applications being handled by the one or more intelligence processing pipelines of the intelligence processing array 105.

In a preferred embodiment, the flow scoreboard module 114 may include a configuration interface, a token interface, and a notification interface. The configuration interface of the flow scoreboard 114 may be used to read and write an internal state of the flow scoreboard module 114, such as to program trigger conditions that when satisfied, in some embodiments, causes the integrated circuit via a nanoprocessor or the like to initiate a workload. The token interface of the flow scoreboard 114 may enable the intelligence integrated circuit 100 to present tokens to the flow scoreboard 114. In response to the presentation of a token via the token interface, the flow scoreboard 114 may function to update its internal state, and when necessary, update the notification interface according to token parameter values (e.g., token count values or the like, as discussed in further detail in the method 300) and a configuration of the flow scoreboard 114. The notification interface of the flow scoreboard may be implemented by the flow scoreboard module 114 to indicate to the intelligence integrated circuit no that one or more conditions (or prerequisites) for executing one or more programs have been satisfied. It shall be noted that the notification interface of the flow scoreboard module 114 may function to trigger any number of operations within the intelligence integrated circuit 110, for example, data transfer without an explicit program execution.

It shall be noted that the configuration interface, token interface, and/or notification interface may be implemented in any suitable manner including with a combination of modules executed by one or more processing circuits, such as a microprocessor.

The network on chip system 120 that includes a plurality of network-on-chip routers 125 that function to establish a communication network between the disparate components of the intelligence integrated circuit 100. In one embodiment, each of the chip routers 125 may include dedicated input and output links for receiving and transmitting communications in the North, South, East, and West directions along the architecture 100 and specifically, within the intelligence processing array 105. In some embodiments, the network on chip system 120 enables each of the disparate intelligence processing units no to pass data between them, such that when one intelligence processing unit no completes processing input data to generate an output, the one intelligence processing unit no may function to pass the output via one or more of the network routers of the network on chip system to another intelligence processing unit and/or allow another intelligence processing unit no to grab the output data. As one example, the digital tokens and/or data packets may be carried along the plurality of network routers of the network on chip system 120.

The integrated circuit controller 130 preferably includes chip-level control logic, which includes boot logic, security features, clocking logic, and the like.

The tile sector controller circuit 140 preferably includes a high voltage portion or circuit of the intelligence processing computing architecture 100 that enables the reprogrammable non-volatile memories within the matrix multiply accelerator 111.

The serial connection bus 150 preferably includes one of a universal serial bus (USB) port and a peripheral component interconnect express (PCI express) interface and/or any suitable high-speed. In a preferred embodiment, raw input data (e.g., raw image data or the like) and/or processed input data (e.g., from an upstream device, an upstream layer, etc.) may be received at the serial connection bus 150 and passed into the system via a primary or main buffer component. Additionally, or alternatively, input data received at the serial connection bus 150 may be passed either into a primary buffer of the intelligence processing integrated circuit 100 or directly into a local buffer 118 of an intelligence processing unit 100 via the network on chip system 120. Additionally, or alternatively, the primary buffer, which is sometimes referred to herein as a main buffer, may also be referred to as an off-tile (off-unit) memory or buffer. In particular, since the main buffer operating with the architecture 100 may be arranged remotely from and off of an intelligence processing tile 110, it may be considered an off-tile component.

Additionally, or alternatively, any suitable off-chip connection may be implemented for transmitting data into and/or out of an intelligence processing array 105 and/or throughout the intelligence integrated circuit 100. For instance, any suitable peripheral device including, but not limited to, an imaging device (e.g., a camera or image sensor), a host system (e.g., a system on chip) or workstation, another intelligence integrated circuit, and/or the like.

Accordingly, it shall be noted that any type or kind of data including tokens may be passed along the serial connection bus 150 or other suitable off-chip connection/interface. For instance, data (e.g., results of computations or other outputs, etc.) from the intelligence integrated circuit 100 may be sent out to another device or system via the serial connection bus 150 or off-chip connection. Thus, a flow control, as described in the one or more embodiments herein, may be extended from the intelligence integrated circuit 100 to other devices, when operably connected or interfacing, in some manner. That is, in some embodiments, token-based flow control may be enabled between multiple intelligence integrated circuits 100 or between a device and host.

3. A Method for Network Graph-Based Buffer Sizing

As shown in FIG. 2, the method 200 for graph-based buffer sizing may include identifying a task graph S210, configuring one or more buffer-sizing algorithms S230, and executing one or more buffer-sizing algorithms S240. The method 200 may optionally include evaluating the task graph S220.

3.10 Identifying a Task Graph

S210, which includes identifying a task graph, may function to identify a task graph that graphically associates and/or relates tasks, task dependencies, and/or buffers to one another. In one or more embodiments, identifying a task graph may include receiving a constructed task graph or constructing a new task graph based on an optimized network graph for a neural network application or the like. It shall be noted that for constructing a task graph, reference is made to U.S. patent application Ser. No. 17/193,302, filed on 4 Mar. 2021, titled SYSTEMS AND METHODS FOR INTELLIGENTLY BUFFER TRACKING FOR OPTIMIZED DATAFLOW WITHIN AN INTEGRATED CIRCUIT ARCHITECTURE, which is incorporated herein in its entirety by this reference.

In one or more embodiments, a task graph (e.g., an identified task graph) may include nodes that represent tasks, edges that may represent dependencies between tasks, and task operands and/or buffer nodes that may represent data buffers. Additionally, or alternatively, in such embodiments, the task graph may include one or more task graph starting locations that may indicate a beginning of the task graph, and one or more task graph exit locations that may indicate the conclusion (or end) of the task graph. As will be further discussed below (e.g., in S220-S240), one or more buffer-sizing algorithms may function to evaluate the task graph between the task graph starting location and the one or more task graph exit locations. That is, the one or more task graph starting locations and the one or more task graph exit locations may function to provide evaluation bounds (or evaluation parameters) for the one or more buffer-sizing algorithms.

It shall be noted that the task graph may further comprise one or more subgraphs (and/or one or more split-join graphs and/or one or more skip link graphs). A subgraph, a split-join graph, or a skip link graph may represent a region (or portion) of the task graph, in which, the task graph may (1) split into a plurality of branches (e.g., more than one task routing direction) and (2) the plurality of branches may rejoin (or merge together) at a downstream location.

In operation, a split (in the task graph) may occur when a plurality of launchers may cause a plurality of tasks to read from a data buffer (hereafter referred to as "buffer"), and a join (in the task graph) may occur when a plurality of launchers may cause a plurality of tasks to write to a downstream buffer (e.g., the same downstream buffer).

Furthermore, in one or more embodiments, S210 may function to classify portions of the task graph according to a global perspective and/or a local perspective. A global perspective of the task graph, as referred to herein, may be a translation of a neural network layer accounting for a plurality of (or all) buffers, a plurality of (or all) tasks, and/or a plurality of (or all) task dependencies. A local perspective of the task graph, as referred to herein, may be a translation of a portion of a neural network layer accounting for a target portion or target region of the task graph (e.g., not considering the task graph in its entirety).

As will be further discussed below, identifying different perspective views of the task graph may aid the one or more buffer-sizing algorithms in globally or locally evaluating the task graph.

3.20 Evaluating the Task Graph

Optionally, S220, which includes evaluating the task graph, may function to identify attributes (e.g., factors, parameters, features, characteristics, or the like) of a task graph that may potentially lead to a deadlock occurrence. In one or more preferred embodiments, S220 may function to identify edge cases (e.g., complex cases exceeding a complexity threshold) that may lead (or factor into) a deadlock occurrence.

In one or more embodiments, S220 may function to evaluate the task graph by analyzing, passing-through, and/or scanning the task graph to identify and/or predict one or more portions of the task graph that may potentially cause (or contribute to) a deadlock event (or state).

For example, a potential deadlock event may be caused by inapt (e.g., non-suitable or insufficient) buffer sizes (e.g., physical buffer sizes). A physical size of a buffer, as referred to herein, may be an allocated region and/or a portion of a physical memory storage unit (e.g., the local buffer 18, on-tile SRAM, SRAM, etc.) used to temporarily store data (e.g., task data). Therefore, in one or more embodiments, the physical size of the buffer may be constrained and/or limited by the allocated physical memory storage unit of an intelligent processing tile.

For instance, deadlock may occur when a buffer does not have enough space to receive data (e.g., the buffer does not have enough space for one or more producer tasks to write into the buffer) and the buffer may not include enough data for a given consumer task (i.e., a read task) to readout or copy data out of the buffer to make space for one or more other tasks (e.g., producer tasks) to act on the buffer. In such example, the one or more producer tasks, the one or more consumer tasks, and the buffer are in deadlock as the producer tasks and the consumer tasks may not be able to progress further.

A second example of a potential deadlock event may be when multiple producers (e.g., writing tasks), multiple consumers (e.g., reading tasks), and/or combinations thereof are attempting to perform operations (e.g., reading operations and/or writing operations) on a buffer. For instance, consider two tasks (e.g., a first task and a second task). The first task may be waiting to read a tail of a first buffer and the second task may be waiting for new data to appear in a head of the first buffer. In such example, new data may not be written to the head of the first buffer until the first task completes. Thereby, being in a deadlock state.

A third example of a deadlock event may be caused by task dependencies in conjunction with multiple producers and/or multiple consumers. Adding onto the above example (e.g., the second example), the first task may be waiting for storage (or space) to become available in a second buffer (e.g., a target buffer, a destination buffer, etc.), such that the first task may read the tail of the first buffer and may write the result into the second buffer. However, the first task may be waiting on a third task to execute to have accessible storage (or space) available, but as the third task may depend on the second task, the third task may not execute until execution of the second task. Therefore, this may result in a deadlock state as the tasks (e.g., the first task, the second task, and the third task) are waiting on one or more resources (e.g., one or more buffers) currently allocated to another task.

A fourth example of a deadlock event may be caused by a split-join graph and/or a skip link graph. As described previously, a split-join graph and/or a skip-link graph may split into a plurality of branches (e.g., more than one task routing direction) and rejoin at one or more downstream locations. In such example, deadlock may occur in split-join graphs and/or skip link graphs when an imbalance of data flow (e.g., task data) occurs across one or more branches (e.g., task routing directions).

In operation, S220 may function to evaluate the task graph to identify one or more of the examples described above and/or any other type of cases that may potentially lead to a deadlock occurrence (or state). It shall be noted, to prevent the integrated circuit 100 (implementing the method 200) from becoming in a deadlock state, the identified task graph of S210 and/or one or more attributes of the task graph may be used in its entirety or in-part for one or more buffer-sizing algorithms of S230.

3.30 Selectively Implementing One or More Buffer-Sizing Algorithms

S230, which includes implementing one or more buffer-sizing algorithms, may function to implement (or construct) one or more buffer-sizing algorithms to identify one or more physical buffer sizes for one or more buffers associated with the identified task graph of S210. In a preferred embodiment, S230 may function to configure and/or construct one or more buffer-sizing algorithms that, when given a deep neural network (DNN) graph, artificial neural network (ANN) graph, or the like, compute a deadlock-free lower-bound on the size of physical buffers. Accordingly, in one or more preferred embodiments and upon execution of the one or more buffer-sizing algorithms, S230 may function to hypothetically model buffer-sizes (e.g., buffer operations and data) in a software-based environment based on the task graph and algorithmic configuration (e.g., algorithmic structure, iteration heuristics, and the like) of the one or more buffer-sizing algorithms, as shown generally by way of example in FIGS. 3-5. For instance, upon execution of the one or more buffer-sizing algorithms, the identified task graph (of S210) may be accepted as input into the one or more buffer-sizing algorithms to identify (and/or set) a physical buffer size condition or optimization objective for one or more buffers associated with the identified task graph of S210 and artificial neural network application.

In one or more embodiments, the physical buffer size condition may be the smallest possible (bit) size of a physical buffer that prevents deadlock. In an alternative embodiment, the physical buffer size condition may be an optimal buffer size that balances for performance (e.g., throughput) while attempting to minimize one or more physical buffer sizes. Stated another way, the identified or set physical buffer size condition may vary between one or more buffer-sizing algorithms as the algorithmic structure (or configuration) between one or more buffer-sizing modeling algorithms may vary.

3.30 (A) Physical Buffer-Sizing Minimization

Figure 3:
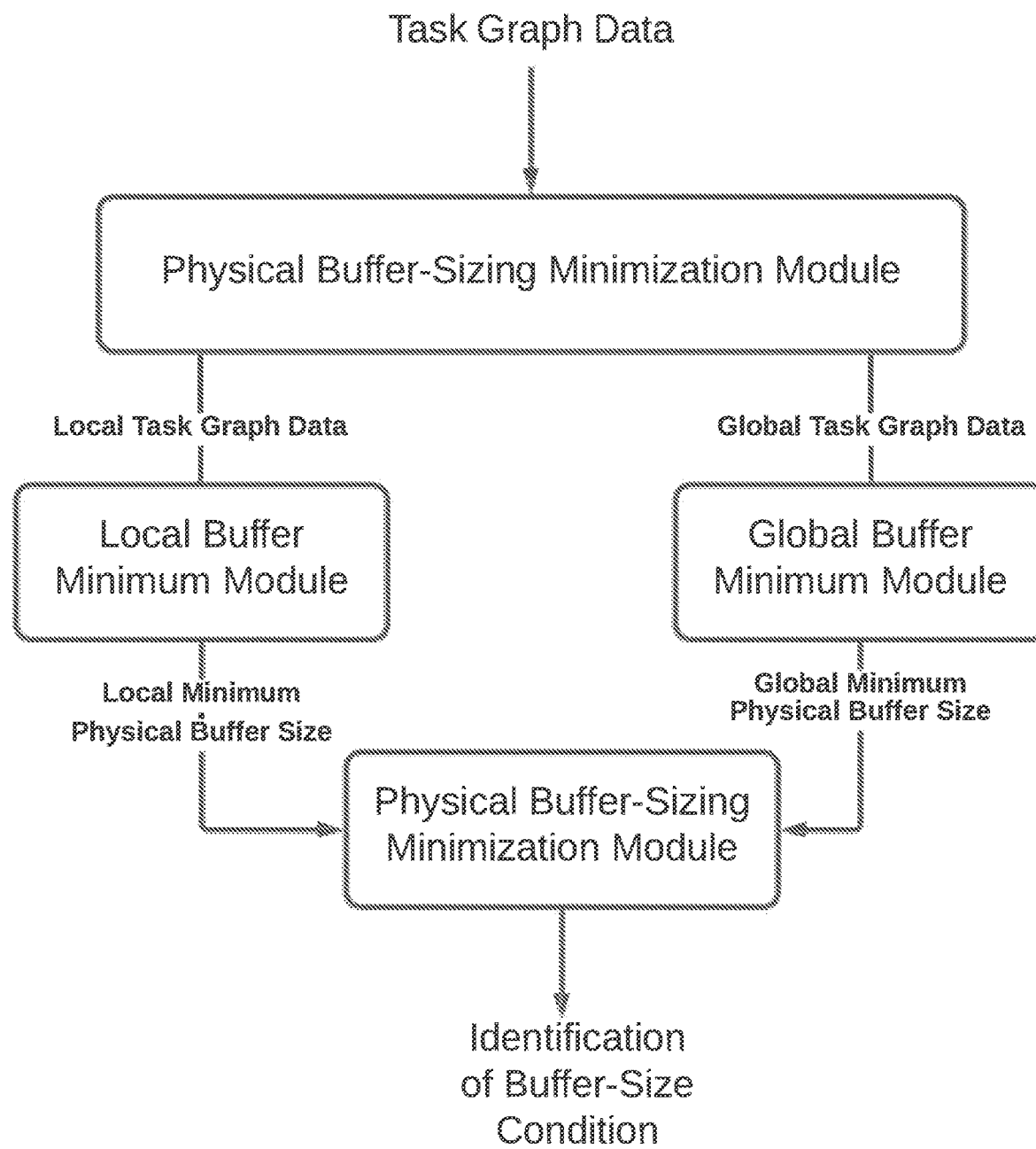
FIG. 3 illustrates an example schematic of a physical buffer-sizing minimization algorithm implementing portions of the method 200 of the present application.

In one or more embodiments, a physical buffer-sizing minimization algorithm may be configured to identify a minimum physical buffer size and/or identify lower physical buffer size bounds that prevent deadlock within and/or with an execution of the identified task graph of S210, as generally shown by way of example in FIG. 3. In such embodiments, the minimum physical buffer sizes may include local minimum physical buffer sizes and global minimum physical buffer sizes for a given neural network graph or task graph.

The local minimum physical buffer sizes, in some embodiments, may relate to computed absolute minimum sizes that one or more target buffers may be physically sized based solely on the immediate inputs (i.e., writes) into and immediate outputs (i.e., reads) from the one or more target buffers based on an evaluation of the graphical edges into and out of the one or more target buffers, as illustrated in a task graph for a given application. In some embodiments, the global minimum physical buffer size may relate to computed absolute minimum physical buffer sizes that one or more target buffers may be physically sized based on an evaluation of an entirety (i.e., all buffers or a plurality of inter-dependent buffers) of the task graph. For instance, in some embodiments, the physical buffer-sizing minimization algorithm may attempt to prevent deadlock by identifying for each buffer (of the identified task graph of S210) the greater (or maximum) of the local minimum physical buffer size and the global minimum physical buffer size.

3.30(A)(1) Computing Local Buffer Minimum(s)

In one or more embodiments, configuring the physical buffer sizing minimization algorithm to identify a local minimum physical buffer size for each buffer may include locally evaluating, during a simulation or the like, each buffer associated with the identified task graph of S210. In one or more embodiments, the local minimum physical buffer size may be identified by locally identifying producer tasks and/or consumer tasks (e.g., immediate producer tasks and/or immediate consumer tasks) associated with each respective buffer. That is, in one or more embodiments, the local minimum physical buffer size (for each buffer) may be identified by locally identifying the (local) inflows and (local) outflows of the target buffer according to the task graph.

Stated another way, for each buffer associated with the identified task graph of S210, S230 may function to identify producer graphical edge(s) (e.g., one or more producer tasks) and consumer graphical edge(s) (e.g., one or more consumer tasks) that may flow into and out of a buffer node associated with the target buffer to compute a local minimum buffer size (e.g., local physical buffer size minimum).

For example, a producer edge (e.g., a producer task) may be writing sixteen bytes into a buffer node (e.g., the target buffer) and a consumer edge (e.g., a consumer task) may be reading eight bytes from the buffer node. In such example, the local minimum physical buffer size of the target buffer may be sixteen bytes to permit communication between the producer task and the consumer task.

3.30(A)(2) Computing Non-Local Buffer Minimum(s)|Adjusting Buffer Sizes Based on Non-Local Imbalances in Data Flow(s)

It shall be noted that the buffer size minimization algorithm may also need to be configured to account for and/or identify the non-local minimum physical buffer based on non-local imbalances in data flow, as non-local effects (e.g., offset producer tasks and consumer tasks, split-join graphs, considering subregions of the task graph, etc.) may not have been identified (e.g., observed, recognized, etc.) via the local minimum physical buffer size evaluation (e.g., local perspective). For instance, the buffer size minimization algorithm may identify a local minimum physical buffer size of 32 bytes and a non-local minimum physical buffer size of 60 bytes. In such example, a variation of the computed minimum physical buffer sizes may be due to upstream and/or downstream data flow imbalances and/or requirements that affect one or more target data buffers of an associated task graph.

Thus, in some embodiments, as the local minimum physical buffer sizes may not equal the non-local minimum physical buffer size, the buffer size minimization algorithm may function to take or set the maximum (or the greater) of the local minimum physical buffer size and the non-local minimum physical buffer size (e.g., minimum physical buffer size=max (local minimum physical buffer size, non-local minimum physical buffer size). That is, the buffer minimization algorithm (e.g., the physical buffer-sizing minimization algorithm) may function to set and/or identify the minimum physical buffer size for each buffer based on a local evaluation (e.g., the local minimum physical buffer size) of a task graph and a non-local evaluation (e.g., the non-local minimum physical buffer size) of a task graph and select and/or adjust the maximum physical buffer size for one or more target data buffers.

Non-Local Imbalances|Deadlock-Risk Data Buffers

In one or more embodiments, S330 may function to identify one or more regions (i.e., subgraphs) or sub-components of the task graph having an imbalanced flow of data that may result in deadlock. In such embodiments, the one or more regions of the task graph of a target application or algorithm having data flow imbalances and correspondingly, insufficient data throughput and/or deadlock may include one or more buffers, sometimes at data flow critical junctures, that may be incorrectly sized (e.g., too small). That is, S330 may function to identify subgraph regions having one or more buffers having physical sizes that may be not sufficiently large enough to handle larger volumes of data being produced and/or consumed by a plurality of producer-consumer tasks within the one or more subgraph regions of a given task graph.

i. Identifying Minimal Split-Join Subgraphs

In a preferred embodiment, S330 may function to identify minimal split-join subgraphs, which may include identifying subgraphs or regions of the task graph that include data buffers located at splitting and/or joining branches as targets for buffer-sizing optimization. In such preferred embodiment, a probability of a data flow imbalances and/or deadlock increases within minimal split join subgraphs, which may result from either/and multiple consumer tasks of the multiple split branches operating on a single data buffer at a location of the split or multiple producer tasks of the multiple split branches operating on a single data buffer at a location of the join. That is, as a result of a split, the multiple branches stemming from the split location may overly tax a data buffer located at the split location. Similarly, as a result of a join of multiple branches, multiple, distinct producer tasks located immediately prior to a data buffer at a join location of the multiple branches may overly write data into the data buffer at the join.

In such preferred embodiment, S330 may function to identify one or more deadlock-risk buffers or target buffers for physical re-sizing that may include, but should not be limited to, one or more of a data buffer at a beginning of a branch split and a data buffer located at an ending of the split branches or where split branches join together (i.e., the branch join).

It shall be noted that while data buffers at a location of a split and/or at a location of a join of a subgraph of a given task graph may preferably be identified as likely or probable targets for buffer optimization or buffer re-sizing, S330 may function to identify and/or select any suitable or intermediate buffer between a split and a join buffer or immediately preceding or immediately follow buffers at a split or join for buffer optimization (e.g., increased physical buffer space allocation).

ii. Selecting Optimal Data Buffer for Re-Sizing

For each identified minimal split-join subgraph or the like, S330 may function to select one or more deadlock-risked or deadlock-inducing data buffers for buffer optimization and/or buffer re-sizing. S330 may preferably function to select one or more of the data buffer at a location of the split and the data buffer at the location of the join based on predicting whether re-sizing at the split or re-sizing at the join would more likely minimize the total physical buffer size; since a probability or likelihood of deadlock is increased at these buffers due to an increased reliance of either multiple consumer tasks or multiple producer tasks at the given split data buffer or join data buffer.

Additionally, or alternatively, S330 may function to select, for each identified minimal split-join subgraph, one or more deadlock-risked or deadlock-inducing data buffers for optimization and/or data buffer re-sizing that may include intermediate data buffers that may be located between a split location and a join location. That is, in some embodiments, the selection of data buffers for re-sizing includes selecting intermediate data buffers that may be downstream of a split data buffer and/or upstream of a join data buffer.

It shall be recognized that any suitable data buffer selection criteria may be implemented for selecting a target data buffer for re-sizing to prevent deadlock and/or improve data flow in a subregion of a task graph.

iii. Computing Data Flow Imbalances

Additionally, or alternatively, S330 may function to compute data flow imbalances within an identified split-join subgraph to identify one or more minimum sizes for each of the one or more selected data buffers, which may be the target of data buffer re-sizing and/or buffer optimization.

In one or more embodiments, computing the data flow imbalances may include evaluating data loading (e.g., write tasks) into a selected data buffer and data extraction (e.g., read tasks) from the selected data. In such embodiments, if it may be computed that the data loading to the selected data buffer is performed at a higher rate such that the selected data buffer becomes full prior to accumulating sufficient data for one or more specific reads or consumption tasks from the selected data buffer may occur, S330 may function to identify a data flow imbalance at the selected data buffer that causes deadlock (i.e., an inability to read), which in this case may be the inability for one or more consumer tasks to consume from the selected data buffer.

Conversely, in the circumstance that data loading into a selected data buffer occurs at a cadence or rate that is slower than a pace of consumption of data from the selected data buffer by a plurality of consuming tasks along the multiple branches, S330 may function to identify a data flow imbalance that reduces throughput and/or may be deadlock-inducing to an upstream data buffer from which the target data buffer may perform read operations.

Accordingly, based on identifying the one or more data flow imbalances, S330 may function to compute a minimum physical size for each selected data buffer within the split-join region that avoids deadlock and/or improves throughput.

Additionally, or alternatively, S330 may function to vary a selection of the one or more target data buffers to identify additional data buffers of the task graph that may be minimally re-sized to avoid deadlock. In such embodiments, S330 may function to evaluate and/or compare the proposed physical re-sizing of each of the selected and/or targeted data buffers to identify which of the data buffers requires the smallest increase in total physical size to avoid deadlock.

Thus, in one or more embodiments, data buffers that may be selected for adjustment and/or physical size increases may be different than the data buffers at a location of a split or a location of a join.

iv. Adjusting Physical Sizes of Selected Data Buffers

Additionally, or alternatively, S330 may function to adjust and/or set the physical size of one or more selected data buffers based on a computed minimal physical size for each of the one or more selected data buffers that avoids deadlock. In some embodiments, S330 may function to adjust a plurality of the selected data buffers based on a subset that require the smallest size increase adjustments. In one embodiment, S330 may function to adjust one or a subset of the plurality of selected data buffers that allows for a minimum total aggregated physical data buffer size for a given subgraph region of the task graph.

3.30 (B) Simulation-Based Buffer-Sizing Algorithm

Figure 4:
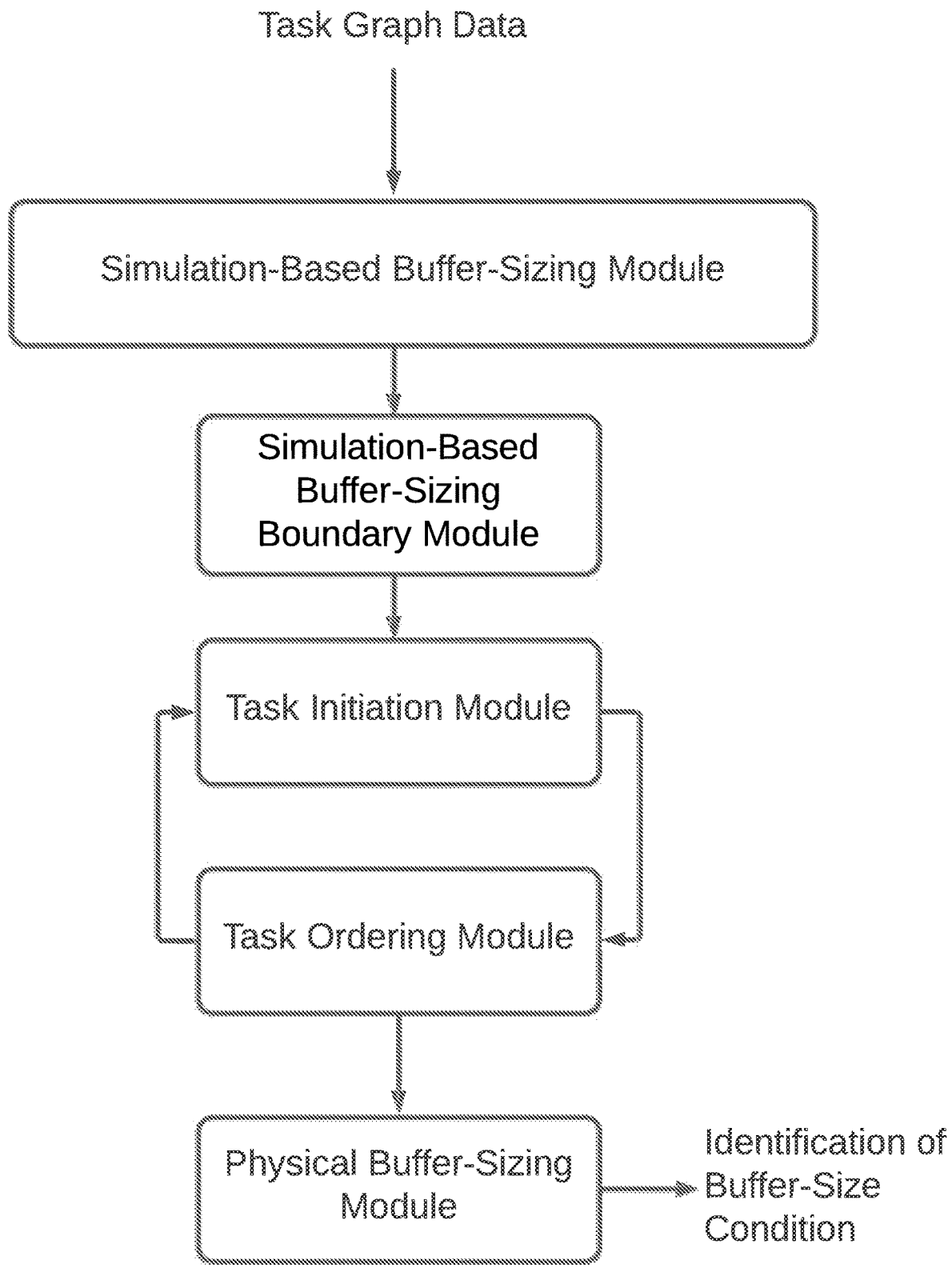
FIG. 4 illustrates an example schematic of a simulation-based buffer-sizing algorithm implementing portions of the method 200 of the present application.

In one or more embodiments, a simulation-based buffer-sizing algorithm may be configured to identify a minimum physical buffer size and/or identify a lower bound for one or more physical buffer size(s) that prevents deadlock based on simulating dataflow through the identified task graph of S210, as generally shown by way of example in FIG. 4. It shall be noted that the simulation-based buffer-sizing algorithm may also be used to identify physical buffer size(s) requirements that maximizes for performance (e.g., throughput). Configuring the simulation-based buffer-sizing algorithm to compute one or more physical buffer sizes may require setup of one or more configurable simulation parameters and/or iteration heuristics. Configurable parameters of the simulation-based algorithm may be based on one or more simulation-based boundaries (e.g., heuristics), data initializations, and/or task execution orders.

Configuring One or More Simulation-Based Boundaries

In one or more embodiments, configuring heuristics (for the simulation-based buffer-sizing algorithm) may aid in providing simulation boundaries to prevent illogical iteration orders of one or more producer tasks and/or one or more consumer tasks (e.g., one or more heuristics may be chosen to select iteration orders that attempt to minimize physical buffer sizes or maximize performance). That is, one or more heuristics of the simulation-based buffer-sizing algorithm may be configured to contribute and/or govern a suitable (or applicable) iteration order of the producer tasks and consumer tasks identified, in part, by the task graph. It shall be noted that in one or more embodiments, heuristics may be implemented directly within the algorithm and/or at least identifiable or accessible to the algorithm (e.g., the simulation-based buffer-sizing algorithm).

For instance, in one or more embodiments, one or more heuristics of the simulation-based buffer-sizing algorithm may be configured to prevent a plurality of producer tasks writing into a target buffer when one or more consumer task mays be read from the target buffer. In such instance, the one or more heuristics may prevent continuous and/or excessive writing into the buffer, thereby, assisting with minimizing physical buffer sizes. That is, intelligently configuring a task execution order that interjects one or more read outs of a target buffer after a set number of writes to the target buffer may function to minimize a physical requirement size of the target buffer by creating space for additional writes, by virtue of the expected readout or consumption of data from the target buffer.

Another example of heuristics of the simulation-based buffer-sizing algorithm may be to position (or model) the largest buffer (e.g., the largest physical size buffer) just before a split in a split-join graph component of a given task graph. In such example, the aforementioned heuristic may prevent unnecessary large physical buffers in one or more branches of the split-join graph. It shall be noted that the one or more heuristics may be used to beneficially aid the simulation-based algorithm in minimizing physical buffer sizes, while preventing deadlock.

Yet another example a buffer-sizing heuristic defined for the simulation-based buffer-sizing algorithm may include identifying a split-join graph component of the task graph. In such embodiments, S230 executing the simulation heuristic may function to maintain, during a simulation session, a physical buffer size of one or more distinct data buffers of a first branch of the split-join graph component causing an increase in one or more distinct data buffers of a second branch of the split-join component. In this way, the one or more distinct data buffers of the first branch may be maintained at a current size while a size of the target data buffer of the second branch may be increased.

In another example a buffer-sizing heuristic defined for the simulation-based buffer-sizing algorithm may include setting simulation heuristics that govern an execution of a read operation along a tail position of a distinct data buffer of the plurality of distinct data buffers to minimize a latency in consuming from a head position of the distinct data buffer. In some embodiments, if a circular buffer or the like is not yet filled, it may cause delays in a read operation of the circular buffer until a head of the circular buffer is filled; however, if the one or more read operations may be redirected to a tail of the circular buffer, it may improve throughput while simultaneously reducing a physical sizing requirement for the target data buffer.

Initializing a Task

Additionally, or alternatively, the simulation-based algorithm may be configured to initiate (or initialize) the flow of data through the task graph. It shall be noted that data flow analysis (DFA) may be used, in some embodiments, to initialize the flow of data for identifying sizes of one or more buffers associated with the task graph. That is, to begin simulating data flow through the task graph, the simulation-based buffer-sizing algorithm may function to initiate or initialize data flow (e.g., initializing a first task, initiating a first task, etc.) simulations through the task graph. Therefore, at least one technical benefit of initializing data simulations through the task graph may be to inform the simulation-based algorithm that a respective task may read a respective portion of an input buffer in a first shape (e.g., an n-dimensional (tensor) shape or the like) and may write to an output buffer in a second shape.

Intelligent Ordering of Tasks

Additionally, or alternatively, in one or more embodiments, the simulation-based buffer-sizing algorithm may be configured to identify an intelligent simulation order (e.g., a simulation order that functions to minimize and/or optimize physical buffer sizes, task ordering, or the like) for subsequent tasks iterations. In a first implementation of intelligently simulating the task execution order, S230 may function to identify an intelligent simulation order based on identifying subsequent tasks that may be executed, while minimizing buffer sizes (e.g., physical buffer sizes). In a second implementation of intelligently simulating the task order, S230 may function to identify an intelligent simulation order based on identifying subsequent tasks that account for both minimizing physical buffer sizes and task timing (e.g., simulating task execution timing based on how tasks may be scheduled on the integrated circuit 100).

For example, after the simulation-based algorithm initializes a target task (e.g., initializing a first task), the simulation-based buffer-sizing algorithm may be configured to identify a list of subsequent tasks that may be initiated (or initialized) next. It shall be noted that the simulation-based buffer-sizing algorithm may be configured to identify from the list of tasks, the most suitable task to be initiated next based on one or more of minimizing physical buffer sizes, performance (e.g., throughput), task dependencies, and/or combinations thereof.

Thereafter, in one or more embodiments, after simulating a plurality of tasks (e.g., all tasks), the algorithm (e.g., the simulation-based buffer-sizing algorithm) may be configured to identify the local and/or non-local minimum physical buffer size(s) for one or more buffers and/or a plurality of buffers of the identified task graph.

3.30 (C) Linear Programming Buffer-Sizing Algorithm

Figure 5:
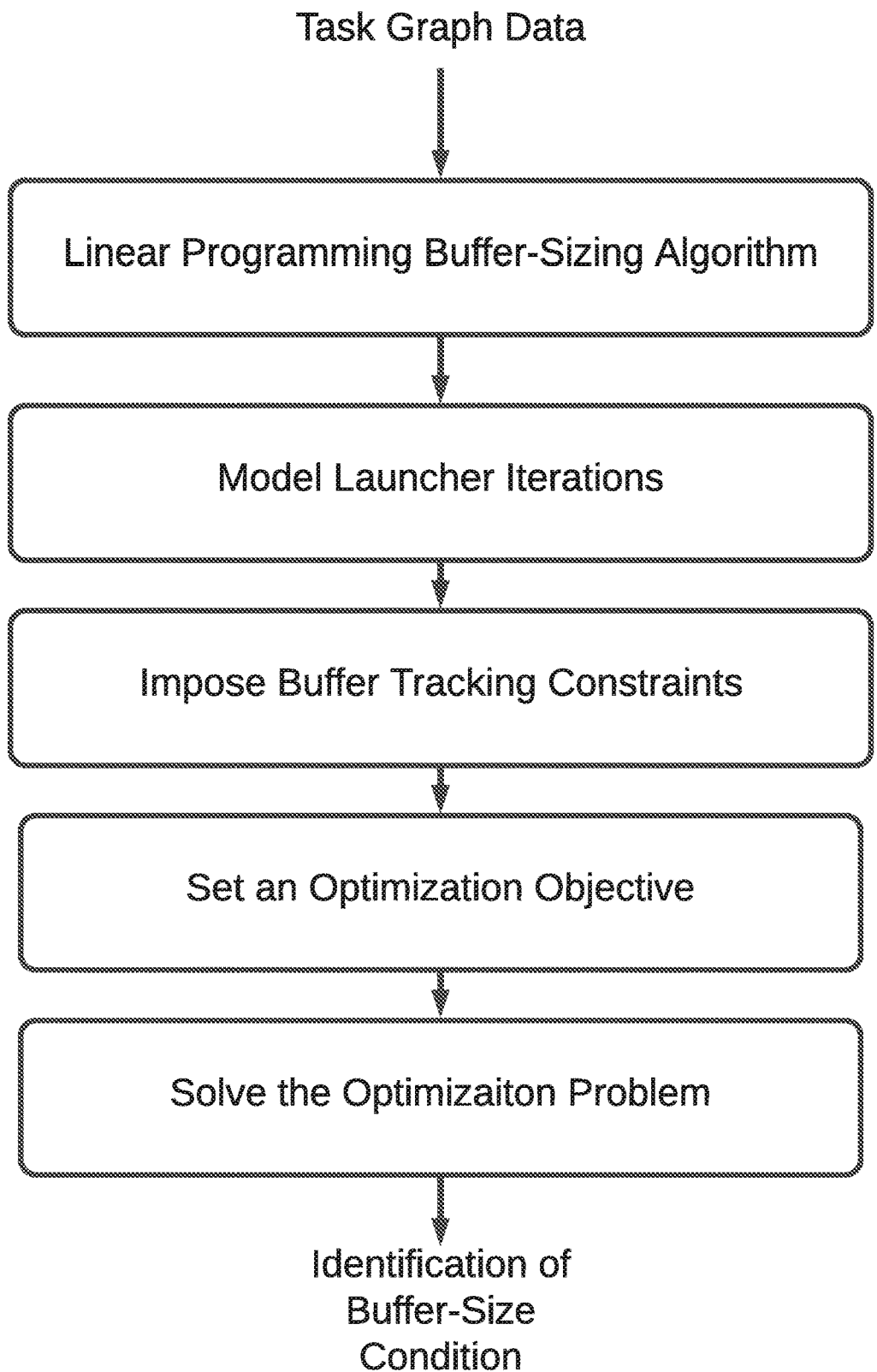
FIG. 5 illustrates an example schematic of a linear programming buffer-sizing algorithm for implementing portions of the method 200 of the present application.

In one or more embodiments, a linear programming buffer-sizing algorithm may be configured to identify one or more minimum physical buffer sizes that prevent deadlocks, while accounting for maximum performance (e.g., throughput) based on defining a model data flow through the identified task graph of S210, as generally shown by way of example in FIG. 5. It shall be noted that the models or linear components that govern or define the linear programming buffer-sizing algorithm may vary based upon varying iteration rate approaches (e.g., iteration rate assumptions) and various other constraints or assumptions. In a first implementation and a second implementation of the linear programming buffer-sizing algorithm, the models and/or linear components that govern the linear programming buffer-sizing algorithm may vary according to uniform and non-uniform iteration rates.

First Implementation|Uniform Rate of Launcher Iterations within and Between Frames In the first implementation of the linear programming buffer-sizing algorithm, one or more linear expressions (e.g., the linear equations) that model data flow through the task graph may be based on a uniform launcher iteration rate within and between frames (e.g., uniform rate of launcher iterations even between frames). That is, an assumption of a uniform launcher iteration rate assumes a constant and/or continuous triggering or launching of iterators through a given convolutional window frame and even through a space between the given convolutional window frame and a next frame. In such implementation and each of which will be further discussed below, the linear programming algorithm may be configured to model the iterations for one or more (or a plurality of) target launchers, identify one or more buffer tracking constraint requirements, and set a non-local optimization objective.

Modeling Launcher Iterations

As discussed above, in the first implementation of the linear programming buffer-sizing algorithm, a constant rate of iteration may be assumed. A constant rate of iteration, as referred to herein, generally relates to a constant and/or continuous triggering or launching of iterations through a given convolutional window frame and even through a space between the given convolutional window frame and a next convolutional window frame.

In the first implementation of the linear programming buffer-sizing algorithm, the algorithm may be configured to compute the number of iterations or triggers for each launcher as a function of time based on the constant rate of iteration. Triggering of a launcher, as referred to herein, may initiate a program (e.g., a task) which initiates consumption (e.g., one or more reads) from a target buffer and production (e.g., one or more writes) to a target buffer.

It shall be noted that modeling the iterations as a constant and/or continuous triggering or launching of iterations may permit the linear programming buffer-sizing algorithm to obtain a model of launcher head(s) and launcher tail(s) for one or more (or a plurality of launchers) as a function of time.

For instance, in one or more embodiments, computing the number of triggers (or iterations) may be mathematically expressed as $\tilde{n}^{(i)}(t) = 1 + \alpha^{(i)} * (t - t_0^{(i)})$, where $\tilde{n}^{(i)}(t)$ may be the number of times a target launcher has been triggered as a function of time, $\alpha$ may be the iteration rate, $t$ may be the time, and $t_0^{(i)}$ is the first trigger time of the target launcher within a frame.

It shall be noted that the first trigger time of the target launcher (e.g., $t_0^{(i)}$) may be determined by a linear programming solver or the like. It shall be further noted that as the iteration rate (e.g., $\alpha$) may be known in the first implementation, the linear programming algorithm may be able to compute linear functions for the upper bounds and lower bounds on the number of consumption triggers and the number of production triggers for each launcher as a function of time, as non-linear functions are not readily solvable by the linear programming solver. Accordingly, this may aid the algorithm (e.g., the linear programming algorithm) to compute upper and lower bounds on the launcher head and launcher tail of data in the target buffer as a function of the number of consumptions and the number of productions for the target launcher.

Identifying Buffer Tracking Constraint(s)

Additionally, in the same or one or more alternative embodiments, the first implementation of the linear programming buffer-sizing algorithm may function to identify one or more buffer constraints, which may translate into a constraint on the first trigger time for each launcher. For instance, the first buffer tracking constraint may require that the producer tail may be greater than and/or equal to the consumer head at all times, which may be mathematically expressed and include the flat size of the target buffer, the time duration of the frame, a time delay between the trigger time and the time that the flow scoreboard module 114 is notified of consumption for all consumers, a time delay between the trigger time and the time that the flow scoreboard module 114 is notified of production for all producers, a number of times a target launcher has been triggered for each frame, the head of the consumer iterator for the target launcher for the first iteration of the target launcher within the frame, a tail of the consumer iterator for the target launcher for the last iteration within the frame, an absolute value of the error value between the actual number of triggers and the linear approximation for all producers and consumers, respectively. Stated another way, the first buffer tracking constraint may be imposed to inform the linear programming buffer-sizing algorithm that or when consumption from a buffer may occur.

Additionally, or alternatively, a second buffer tracking constraint may be imposed to inform the linear programming buffer-sizing algorithm that production into a buffer may occur. For instance, the second buffer tracking constraint may be analytically expressed and include a time delay between the trigger time and the time that the flow scoreboard module 114 may be notified of the consumption, a time delay between the trigger time and the time that the flow scoreboard may be notified of the production, a head of the producer iterator for the target launcher for the last iteration of the target launcher within the frame, a tail of the producer iterator for the target launcher for the first iteration within the frame, a number of triggers of one or more producer launchers, a number of triggers of one or more consumer launcher, an error value between a number of triggers and the linear approximation for the producers, and an error value between the number of triggers and the linear approximation for the consumers.

Setting a Global Optimization Objective

Additionally, in the same or one or more alternative embodiments, the first implementation of the linear programming buffer-sizing algorithm may function to set a global optimization objective. The global optimization objective may vary based upon various performance applications, data transmission requirements, etc. For instance, in a preferred embodiment, the global optimization objective may be to minimize the total physical size (e.g., sum of all physical buffers) for the plurality of buffers associated with the task graph. That is, the linear programming solver may be used to find the launcher start times that minimizes the sum of the physical sizes of all buffers (e.g., the total physical buffer size), as the start times of the launchers may be the only undetermined variable, as will be further discussed in S240.

Second Implementation|Uniform Rate of Launcher Iterations within a Frame but Non-Uniform Between Frames In the second implementation of the linear programming buffer-sizing algorithm, the linear expressions or linear model components (e.g., the equations, the linear equations, etc.) that represent modeling data flow through the task graph may be based on a uniform launcher iteration rate only within each frame or convolutional window frame (e.g., uniform rate of launcher iterations only within each frame). In such implementation and each of which will be further discussed below, the linear programming buffer-sizing algorithm may be configured to model the number of triggers or iterations for a target launcher and the iteration rate, as well as configure a model for computing the minimum physical buffer physical size.

Computing Launcher Iteration Rates

As described above, the linear programming buffer-sizing algorithm may be configured to approximate the number of triggers or iterations as a function of time for each launcher during a given frame. Triggering of a launcher, as referred to herein, may initiate a program (e.g., a task) which initiates one or more consumption tasks (e.g., one or more reads) from a target buffer and one or more production tasks (e.g., one or more writes) to a target buffer.

It shall be further noted that in the second implementation, the linear programming algorithm for a target launcher may be configured to compute an iteration rate (e.g., $\alpha$) based on matching conditions (e.g., for every four reads one write may occur, reads are four bytes and writes are only two bytes, ensuring producer tasks are always ahead of consumer tasks, etc.) between one or more producer tasks and one or more consumer tasks of the target buffer associated with the target launcher. Accordingly, in such embodiments, iteration rates of producer tasks may be determined in advance based on a given matching condition, which may result in layer durations or frame durations that differ from the assumed frame rate of the uniform frame rate algorithm (i.e., the first implementation).

Physical Buffer Size Model

Accordingly, in the second implementation, the linear programming buffer-sizing algorithm may function to configure one or physical buffer-sizing models based on a number of triggers as a function of time for a target launcher and the linear bounds of the heads and tails of the buffer. In this particular model, the minimum physical buffer size may be the difference between the linear bounds at the end points of a producer launcher and a consumer launcher (e.g., maximum overlap interval of the producer launcher and the consumer launcher).

Additionally, or alternatively, in one or more embodiments of the second implementation, the start times and/or end times of a target launcher may not be readily known for a target frame. However, determining the minimum physical buffer size depends on the relative ordering of the start times and end times of producer-consumer launcher pairs. Therefore, in one or more embodiments, S230 may be configurable to select a best hypothesis for the endpoint ordering that would provide an upper bound for the physical size(s) over all possible endpoint orderings. It shall be noted, upon execution of the algorithm and after a linear programming solution may be found, the ordering of the start times and/or end times may be known. Thereafter, S230 may function to modify (e.g., update) the algorithm (e.g., the linear programming buffer-sizing algorithm) with the identified ordering of start times and end times to identify one or more minimal physical buffer sizes required for the task graph identified by S210.

3.30 (D) Profile-Manipulation Buffer-Sizing Algorithm

In one or more embodiments, a profile-manipulation buffer-sizing algorithm may be configured to identify a minimum physical buffer size (for the task graph) that prevents deadlock, while accounting for maximum performance (e.g., throughput) via an iterative profile-manipulation technique. That is, in one or more embodiments, the profile-manipulation algorithm may be configured to minimize physical buffer sizes, while accounting for maximum performance, by intelligently selecting one or more start times for one or more launcher iteration profiles.

For instance, in one or more embodiments, the profile-manipulation algorithm may be configured to construct launcher iteration profiles (e.g., stepwise launcher iteration profiles) for one or more launchers. For example, in one or more embodiments, by assuming a uniform iteration rate, launcher iteration profiles may be constructed. It shall be noted that in one or more embodiments, the launcher iteration profiles may include a buffer head and a buffer tail of a launcher window as a function of time.

It shall also be noted that, in one or more embodiments, the profile-manipulation algorithm may not require (or may not need) start times and/or end times of the launchers to construct (stepwise) iteration profiles, as a uniform iteration rate may be assumed. That is, in one or more embodiments, the form of the launcher iteration profiles may be substantially known, except for the start time of the first iteration for each target launcher iteration profile.

Accordingly, after configuration of the (stepwise) launcher iteration profiles, the profile-manipulation algorithm may be configured to implement an iterative profile-manipulation technique. For instance, S230 may function to preliminary identify start times as a proxy for the plurality of launchers (e.g., the stepwise launcher profiles) with a uniform iteration rate assumption. This may additionally be influenced by heuristics and/or any automated attempt to order/identify launcher start times.

Thereafter, the profile-manipulation algorithm may be configured to iterate the launcher start times by modifying launcher start times (e.g., moving a launcher start time to the earliest possible start time allowed by one or more buffer tracking constraints or the latest possible time start time allowed by one or more buffer tracking constraints). Accordingly, each instance a modification to the listing order of the launcher start time occurs, the algorithm (e.g., the profile-manipulation algorithm) may continue to be executed until the algorithm identifies the minimum physical buffer size. It shall be further noted that the iterative process may continue until convergence of the minimum physical buffer size for the identified task graph of S210.

3.30 (E) Buffer-Sizing Algorithmic Combinations

It shall be noted that in one or more algorithmic combinations (e.g., one or more buffer-sizing combinations), one or more buffer-sizing algorithms may be combinable with another buffer-sizing algorithm. In one or more preferred embodiments, a first buffer-sizing algorithm may be configured to constrain a second buffer-sizing algorithm (e.g., the second buffer-sizing algorithm may be distinct from the first buffer-sizing algorithm).

As described above, the one or more buffer-sizing algorithms (e.g., the physical buffer size minimization algorithm, the simulation-based buffer-sizing algorithm, the linear programming buffer-sizing algorithm, and/or the profile-manipulation buffer-sizing algorithm) may be independently configured to identify a physical buffer size condition for the identified task graph of S210 (e.g., a minimum physical buffer size, a local minimum physical buffer size, a global minimum physical buffer size). However, in one or more embodiments, the one or more buffer-sizing algorithms may not need to solely operate independently, as one or more buffer-sizing algorithms may function to constrain (or inform) another buffer-sizing algorithm.

For example, the linear programming buffer-sizing algorithm may function to constrain and/or inform the simulation-based buffer-sizing algorithm. As the linear programming buffer-sizing algorithm may be configured to globally express the task graph through analytical equations, the linear programming buffer-sizing algorithm may function to solve a global optimization problem for global buffer size(s). Solving for global buffer sizes using the linear programming buffer-sizing algorithm may cause the start times of each launcher to either be the earliest allowed by its respective producers or the latest start time allowed by its respective consumers.

Therefore, in one or more embodiments, the linear programming method may identify the maximum physical buffer sizes (e.g., an upper physical buffer size bound). Combining with the simulation-based algorithm, the simulation-based algorithm may be configured to set the maximum physical buffer size based on the linear programming algorithm. This may permit during data simulation that the physical buffer size does not exceed the upper physical buffer size bound identified by the linear programming method and may ultimately permit the simulation-based buffer-sizing algorithm to identify a minimum physical buffer size for one or more target buffers that may be smaller than the linear programming algorithm (as the linear programming method bounds (e.g., linear bounds) may not be as tight as the bounds of the simulation method).

3.40 Executing One or More Buffer-Sizing Algorithms

S240, which includes executing one or more buffer-sizing algorithms, may function to execute one or more buffer-sizing algorithms to identify a physical buffer size condition based on the identified task graph of S210. In one or more preferred embodiments, executing the one or more buffer-sizing algorithms may include compiling (e.g., using a compiler for) one or more (or all) the buffer-sizing modeling algorithms to translate the programming language used to construct/configure the one or more buffer-sizing algorithms into a machine language understandable to the integrated circuit 100.

It shall be noted that upon executing the one or more buffer-sizing algorithms, S240 may function to identify the physical buffer size condition (e.g., the physical buffer size condition may be the smallest possible size of a physical buffer to prevent deadlock, the physical buffer size condition may be an optimal buffer size that balances for performance while attempting to minimize one or more physical buffer sizes, or the like). Accordingly, after identification of the physical buffer size condition by executing the one or more buffer-sizing algorithms, S240 may function to allocate within and/or inform one or more components of the hardware (e.g., the integrated circuit) for appropriate allocation. Specifically, in one or more embodiments, S240 may function to execute the one or more buffer-sizing algorithms to identify the physical buffer size condition and inform the on-tile buffer (e.g., local SRAM) to allocate one or more buffer sizes appropriately based on the physical buffer size condition.

Additionally, or alternatively, S240 may function to execute the one or more buffer-sizing algorithms to identify the physical buffer size condition and compare the physical buffer size condition to the physical memory available on the computing tile.

4. Computer-Implemented Method and Computer Program Product

The systems and methods of the preferred embodiments and variations thereof can be embodied and/or implemented at least in part as a machine configured to receive a computer-readable medium storing computer-readable instructions. The instructions are preferably executed by computer-executable components preferably integrated with the system and one or more portions of the processors and/or the controllers. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods described herein.

As a person skilled in the art will recognize from the previous detailed description and from the figures and claims, modifications and changes can be made to the preferred embodiments of the invention without departing from the scope of this invention defined in the following claims.

What is claimed is:
1. A method for allocating data buffers for executing an artificial neural network on an integrated circuit, the method comprising:
configuring a buffer-sizing simulation based on sourcing a task graph of an artificial neural network, wherein:
(i) the task graph includes a plurality of distinct data buffers, wherein each of the plurality of distinct data buffers is assigned to at least one producer task and at least one consumer task;
(ii) the buffer-sizing simulation, when executed, computes an estimated physical size for each of the plurality of distinct data buffers of the task graph for implementing the artificial neural network on the integrated circuit;
(iii) configuring the buffer-sizing simulation includes setting simulation parameters that include (a) buffer-size minimization parameters and (b) buffer data throughput optimization parameters;

iteratively executing the buffer-sizing simulation based on setting the simulation parameters, wherein executing the buffer-sizing simulation includes simulating a flow of data through each of the plurality of distinct data buffers; and
generating an estimate of a physical size for each of the plurality of distinct data buffers based on the execution of the buffer-sizing simulation.

2. The method according to claim 1, further comprising:
allocating the physical size to each of the plurality of distinct data buffers on one or more memory circuits of the integrated circuit based on the generated estimate of the physical size for each of the plurality of distinct data buffers.

3. The method according to claim 1, wherein
executing the buffer-sizing simulation includes executing a buffer-sizing minimization algorithm that computes a local minimum buffer size for each of the plurality of distinct data buffers that mitigates an occurrence of deadlock based on direct read operations and direct write operations at each of the plurality of distinct data buffers as illustrated in the task graph.

4. The method according to claim 3, wherein
the occurrence of deadlock relates to an inability write operation to write data to a target data buffer or an inability of a read operation to read data from the target data buffer due to insufficient data.

5. The method according to claim 3, wherein
generating the estimate of the physical size for each of the plurality of distinct data buffers includes:
setting the computed local minimum buffer size for each respective data buffer of the plurality of distinct data buffers as an absolute lower bound of a potential physical size for the respective data buffer.

6. The method according to claim 1, wherein
executing the buffer-sizing simulation includes executing a buffer-sizing minimization algorithm that computes a non-local minimum buffer size for each of the plurality of distinct data buffers that mitigates an occurrence of deadlock based on indirect read operations and indirect write operations at each of the plurality of distinct data buffers as illustrated in the task graph.

7. The method according to claim 6, wherein
generating the estimate of the physical size for each of the plurality of distinct data buffers includes:
setting a greater of the computed non-local minimum buffer size and a computed local minimum buffer size as the physical size for each respective data buffer of the plurality of distinct data buffers.

8. The method according to claim 1, wherein:
setting the simulation parameters includes setting simulation heuristics that govern a task execution order of write operations to and read operations of a distinct data buffer of the plurality of distinct data buffers, and
the simulation heuristics, when executed, cause an interjection of at least one read operation of the read operations between a plurality of write operations of the write operations to the distinct buffer thereby minimizing a physical size of the distinct data buffer.

9. The method according to claim 1, wherein
setting the simulation parameters includes setting simulation heuristics that:
identifies a split-join graph component of the task graph; and
simulates a largest physical-sized data buffer before a split in the split-join graph component thereby preventing a simulation of physical data buffers having a physical size exceeding a maximum size threshold within one or more branches of the split-join graph component.

10. The method according to claim 1, wherein
setting the simulation parameters includes setting simulation heuristics that, when executed:
   identifies a split-join graph component of the task graph; and
   maintains, during a simulation session, a physical buffer size of one or more distinct data buffers of a first branch of the split-join graph component causing an increase in one or more distinct data buffers of a second branch of the split-join component.

11. The method according to claim 1, wherein:
setting the simulation parameters includes setting simulation heuristics that govern an execution of a read operation along a tail position of a distinct data buffer of the plurality of distinct data buffers to minimize a latency in consuming from a head position of the distinct data buffer.

12. The method according to claim 1, wherein
executing the buffer-sizing simulation includes:
   identifying a data flow imbalance at one or more distinct buffers of the plurality of distinct data buffers based on the simulation of the flow of data, wherein a data flow imbalance relates to a loading of data to a target data buffer at a higher rate than a read out of data from the target data buffer resulting in an inability to perform one or more specific read out operations from the target data buffer; and
   computing a minimum physical size for the target data buffer that mitigates the data flow imbalance based on the identified data flow imbalance.

13. The method according to claim 1, further comprising:
computing, via a linear programming algorithm, one or more iteration rates of read operations of and write operations to a distinct data buffer of the plurality of distinct data buffers; and
computing one or more launch times for each of the read operations and each of the write operations that minimizes a physical size of the distinct data buffer based on the computed one or more iteration rates.

14. The method according to claim 1, wherein
executing the buffer-sizing simulation includes:
   identifying a list of tasks comprising write tasks and/or read tasks for a target data buffer of the plurality of distinct data buffers;
   iteratively simulating a plurality of distinct task operation orders based on executing the writes tasks and/or read tasks; and
   setting a task operation order for each of the write tasks and/or read tasks that minimizes a physical size of the target data buffer based on the simulation of the plurality of distinct task operation orders.

15. A method for minimizing a total physical size of data buffers for executing an artificial neural network on a mixed-signal integrated circuit, the method comprising:
   implementing a buffer-sizing simulation based on sourcing a task graph of an artificial neural network, wherein:
      (i) the task graph includes a plurality of distinct data buffers, wherein each of the plurality of distinct data buffers is assigned to at least one write operation and at least one read operation;
      (ii) the buffer-sizing simulation, when executed, computes an estimated physical size for each of the plurality of distinct data buffers for implementing the artificial neural network on the mixed-signal integrated circuit; and
      (iii) configuring the buffer-sizing simulation includes setting simulation parameters that include (a) buffer-size minimization parameters and (b) buffer data throughput optimization parameters; and
   generating an estimate of a physical size for each of the plurality of distinct data buffers based on the implementation of the buffer-sizing simulation.

16. The method according to claim 15, further comprising:
   allocating the physical size to each of the plurality of distinct data buffers on one or more memory circuits of the mixed-signal integrated circuit based on the generated estimate of the physical size for each of the plurality of distinct data buffers.

17. The method according to claim 15, wherein
executing the buffer-sizing simulation includes executing a buffer-sizing minimization algorithm that computes a local minimum buffer size for each of the plurality of distinct data buffers that mitigates an occurrence of deadlock based on direct read operations and direct write operations at each of the plurality of distinct data buffers as illustrated in the task graph.

18. The method according to claim 17, wherein
the occurrence of deadlock relates to an inability to write data to a target data buffer or an inability to read data from the target data buffer due to insufficient data.

* * * * *